United States Patent [19]

Bruce, Jr. et al.

[11] Patent Number: 5,517,637
[45] Date of Patent: May 14, 1996

[54] METHOD FOR TESTING A TEST ARCHITECTURE WITHIN A CIRCUIT

[75] Inventors: William C. Bruce, Jr.; Joseph E. Drufke, Jr., both of Austin; Chema O. Eluwa, Kyle; John M. Hudson, Austin, all of Tex.

[73] Assignee: Motorola, Inc., Schaumburg, Ill.

[21] Appl. No.: 352,934

[22] Filed: Dec. 9, 1994

[51] Int. Cl.$^6$ .................................................. G01R 31/28
[52] U.S. Cl. ..................... 395/500; 364/490; 364/578; 371/22.1; 371/22.3; 371/27; 324/73.1; 324/158.1
[58] Field of Search ........................... 364/488, 489, 364/490, 578; 395/578; 324/158.1, 73.1, 765; 371/22.3, 22.5, 3, 21.1, 23, 27

[56] References Cited

U.S. PATENT DOCUMENTS

| | | | |
|---|---|---|---|
| 4,872,169 | 10/1989 | Whetsel, Jr. | 371/22.3 |
| 5,270,642 | 12/1993 | Parker | 324/158 R |
| 5,281,864 | 1/1994 | Hahn et al. | 327/202 |
| 5,396,170 | 3/1995 | D'Souza et al. | 324/158.1 |

OTHER PUBLICATIONS

Bou-Farhat et al., "The Implementation of a Testable High Performance Display Controller", IEEE 1988, pp. 598–602.
Brglez et al., "A Modular Scan-Based Testability System" IEEE 1988, pp. 408–412.
Halliday et al., "Prototype Testing Simplified by Scannable Buffer and Latches", IEEE 1989, pp.174–181.
Koetes et al., "Designing IEEE 1149.1 Compatible Boundary-Scan Logic Into an ASIC Using Texas Instruments's Scope Architecture", IEEE 1990 pp. 41–44.
Ryan et al., "Generation, Verification, and Execution of Boundary Scan with Built-In Self-Test Hardware for VLSI", IEEE 1990 pp. 40–46.
Shergill et al., "Built-In Test Methodology For a Full Custom Processor Chip", IEEE 571–575.
Teradyne: Victory Software Advertsement; Electronic Engineering Times; pp. 26,27; (Oct. 31, 1994).
AT&T; Software Driven Solutions;p. 15; AT&T Tapdance Software; (Sep. 1990).

*Primary Examiner*—Kevin J. Teska
*Assistant Examiner*—Tan Nguyen
*Attorney, Agent, or Firm*—Keith E. Witek

[57] ABSTRACT

A method for testing a test architecture in a circuit is accomplished by receiving or generating, based on the topology information for the circuit, a Boundary Scan Description Language (BSDL) description of the test architecture which is then verified for correct syntax, consistency, and standard compliance. Next, one or more tests are selected from a predetermined set of test methodologies, based on the type of testing to be performed. Self-checking test parameters are generated based on the BSDL description and the selected tests. Using these test parameters, a logic simulation algorithm tests the test architecture of the circuit and generates a report detailing any errors that are discovered.

29 Claims, 4 Drawing Sheets

METHOD FOR TESTING A TEST ARCHITECTURE WITHIN A CIRCUIT

FIELD OF THE INVENTION

This invention relates generally to circuit design, and more specifically to a method for testing test architectures in circuits.

BACKGROUND OF THE INVENTION

Circuits are commonly constructed on printed circuit boards (PC boards). These circuits are often complex and can include a large number of integrated circuits (ICs), wherein the ICs can be in a wide variety of packages. The number of ICs and variety of packages on a PC board makes the functionality of the IC's and the interconnect between them difficult to test.

In order to test complex PC board circuits, test architectures such as boundary scan tests have been developed and are well known in the art. A boundary scan test connects all of the ICs on the circuit board in a serial register chain, and test equipment then serially scans a predetermined series of bits into the serial register chain, wherein the series of bits contains both control and data information. The control information controls a state machine on each IC that uses registers and the data information to test the board interconnect and the ICs. One of the registers on each IC is a boundary scan register that includes all of the input, output, and input/output ports on the IC. An IEEE standard for this type of test architecture has been developed under committee, and is known as IEEE 1149.1, or JTAG.

For the boundary scan tests to effectively verify a PC board circuit under the IEEE 1149.1 standard, the ICs on the PC board need to include a test architecture that is JTAG compliant. PC board circuit designers make use of a boundary scan description of the test architecture which describes the characteristics of the test access port and boundary scan architecture on each IC. A specific format, known as Boundary Scan Description Language (BSDL), is used as a standard for boundary scan descriptions and is specified in Supplement B of IEEE Standard 1149.1. A BSDL description of a test architecture includes such things as register descriptions, number of ports, control instructions supported, etc. Designing and verifying the functionality and JTAG compliance of the test architecture state machine and registers on an IC is a difficult and time-consuming task. In addition, an error free BSDL description of the test architecture on each IC needs to be generated for use by PC board designers.

Two different types of tests are useful for verifying test architectures on integrated circuits. The first type is useful for design verification prior to fabrication, and allows a designer to quickly isolate errors so that they can be corrected. This first type of test requires a large amount of memory and takes a relatively long time to execute, which is not critical as this testing is normally done using logic simulation, and the test is only run as many times as are necessary to verify and debug the test architecture.

The second type of test is for production testing, where functionality, overall fault coverage, compactness, and speed are important issues as the test will be used on each IC that is produced. This type of test, which is normally used after the device has been fabricated, uses minimal memory and quickly determines if the test architecture on the IC is fully functional. If there is an error, however, this type of test rarely provides much insight as to the source of the error.

Typical prior art techniques for verifying test access port and boundary scan architectures use a single compliance test to exercise the test architecture and are aimed towards production testing. In some cases the single test is directed at testing the controlling state machine. Although this strategy is useful for finding errors that occur in the state machine circuitry, it does not thoroughly test the boundary scan register interface, which is where the majority of errors have been found to occur. In cases where the single test is more thorough and does exercise the boundary scan register interface, this single-test technique is still unable to verify complete functionality of internal nodes within the design, and often does not support logic simulation, or provide feedback as to the source of any errors detected.

Other prior art techniques are aimed towards design verification, and are used to generate logic simulation stimulus for testing the ICs. Although these pre-fabrication techniques can be used to verify the test access port and boundary scan architecture through simulation, the tests necessary to do so are often very complex and time consuming to develop, as they involve many serial bit shifting steps and are dependent on the specific implementation of JTAG being tested. Because the tests are not automatically generated, no automatic checking of the test results is available, and more time and effort must be spent to determine if the output produced is error-free. In addition, this technique does not verify the BSDL description of the test architecture.

All known prior-art techniques require a completed BSDL description of the test architecture to be tested. BSDL descriptions are complex text files that are time consuming to construct using a text editor, and even more effort can be spent updating a BSDL description when a slight change, such as reordering of a few pins, occurs in a design. Thus, the prior-art techniques discussed do not aid in the generation of BSDL descriptions.

Therefore, a need exists for a method that automatically generates self-checking production and logic simulation test vectors, verifies JTAG compliance, aids in the generation and verification of BSDL descriptions for test architectures, and provides feedback for correcting detected errors in either the BSDL description or the test architecture.

DETAILED DESCRIPTION OF THE DRAWINGS

Generally, the present invention provides a method for testing a test architecture within a circuit. This is accomplished by receiving or generating, based on the topology information for the circuit, a Boundary Scan Description Language (BSDL) description of the test architecture which is then verified for consistency, correct syntax, and standard compliance. Next, one or more tests are selected from a predetermined set of test methodologies, based on the type of testing to be performed. Self-checking test parameters are generated based on the BSDL description and the selected tests. Using these test parameters, a logic simulation algorithm tests the test architecture of the circuit and generates a report detailing any errors that are discovered. With such a method, test architectures on circuits can be tested in a manner which requires less time and effort, and provides more complete testing with better error-correction feedback than known prior art techniques.

An integrated circuit (IC) test architecture that is compliant with the JTAG standard comprises: a test logic controller implemented in a 16-state machine, at least four dedicated input/output pins, an instruction register, a bypass register, and a boundary scan register. The state machine implementation is functionally identical in all JTAG implementations, whereas the instruction register decoder and boundary scan register will be dependent on the specific IC architecture and the instructions supported.

Figure 1:
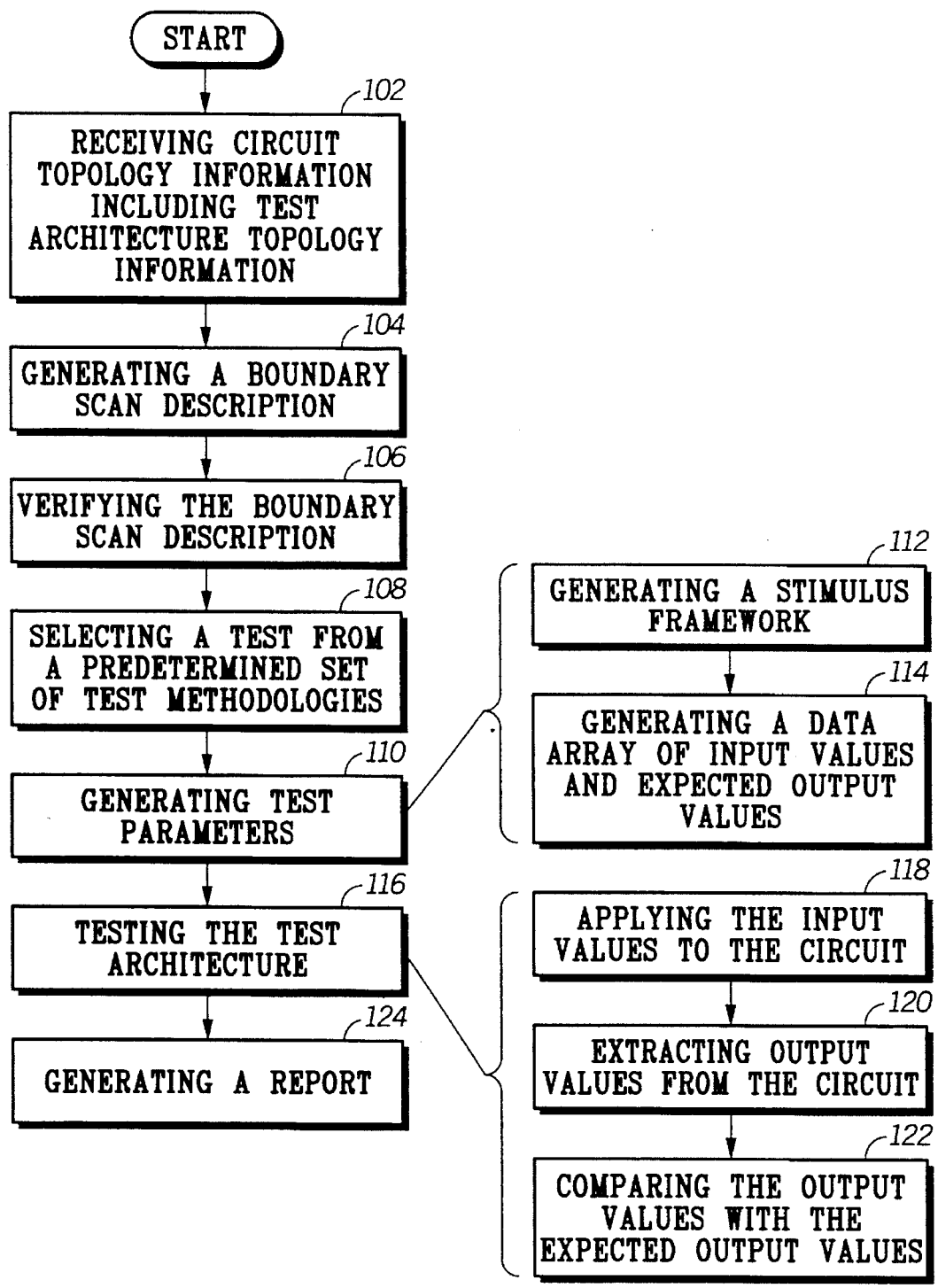
FIG. 1 illustrates, in a logic diagram, a method for testing a test architecture within a circuit in accordance with the present invention.

FIG. 1 illustrates, in a logic diagram, a method for testing a test architecture within a circuit. In step 102, the topology information of the circuit, which includes test architecture topology information (i.e. JTAG topology information) is received in a textual netlist format. The circuit topology information comprises: all of the elements in the circuit, wherein the elements include at least logic gates and transistors; the elements of the test architecture circuitry; the inputs and outputs to the circuit, which include clock signals; and the interconnect coupling the elements, inputs, and outputs. This topology information may be a VERILOG™ IC netlist, which is formatted for use with the VERILOG™ logic simulation algorithm.

At step 104, a boundary scan description is generated, which can be accomplished with a BSDL generation interface provided or by the prior art technique of text-editor entry. The BSDL file contains descriptive information that would be included in a data sheet or user's manual. For example, the BSDL file may include packaging information, pin ordering, etc.

The BSDL generation interface provides an interactive, graphics-based approach to collecting JTAG implementation data for the BSDL file generation. It is not necessary that the user understand the BSDL format or syntax when using the interface, as it will construct a correct BSDL file from the information collected. The interface further aids the user by presenting optional JTAG instructions, supporting user defined JTAG instructions, supporting busses in the boundary scan register, and supporting the standard boundary scan register cell-types that are described in the standard.

When the user has a boundary scan description, which can be a pre-existing BSDL file or one generated with the BSDL generation interface, it will be verified at step 106 for correct syntax, consistency, and standard compliance. If any errors are detected, they are flagged, allowing the user to easily locate and correct the errors in the BSDL file via the interface, which will prevent problems in following steps. Any changes that are made using the interface will cause the rest of the information in the BSDL file to be updated. For example, if an additional cell is inserted in the boundary scan chain, the positions of the other cells are automatically updated.

Once the BSDL file is complete and correct, a test can be selected from a predetermined set of test methodologies in step 108. Another graphic interface is provided for selecting one or more tests which will be used to exercise the test architecture present in the circuit. A menu of test methodologies is provided by the graphic interface, allowing the user to choose to perform any one test or group of tests. The majority of these test methodologies, which are used in conjunction with the BSDL description to generate the actual tests to be performed, are aimed at design verification, but a production test methodology is also supported.

The different types of design verification tests that are supported include: flush tests which determine if the selected register is of the correct length and whether the register can shift both ones and zeros; instruction tests which verify the functionality of each of the instructions that are supported; control cell tests which verify that control cells control the appropriate cell or cells; and walking tests which verify the functional independence of each signal in the boundary scan register. Production test includes detecting stuck-at faults and is intended to be an efficient test for production purposes, but often the errors detected by the production test are difficult to diagnose, as the feedback provided is limited. The production test, which is the type of test commonly used by prior art techniques, attempts to detect any errors that could be present on an IC in the smallest number of test parameters. If an error is detected by the production test, the IC is rejected, regardless of where the error is located. Therefore, the parameters are not structured to determine the location of an error, but rather simply to detect the presence of the error. The production test is efficient in error detection, but does not concern itself with pinpointing the cause of the error. This is desirable for testing fabricated ICs, but not for debugging a test architecture prior to fabrication.

Once a test has been selected, test parameters, based on the boundary scan description and the selected test, are generated in step 110. The test parameters may be VERILOG™ test vectors for the circuit, which are vectors formatted specifically to be used with the VERILOG™ logic simulation algorithm. The test parameter generation can be accomplished with steps 112 and 114.

In step 112, a stimulus framework for the logic simulation algorithm is generated based on the boundary scan description. The stimulus framework may be formatted in VERILOG™ logic simulation format, wherein the user adds the correct hierarchical pathname for each cell in the test architecture. The framework is designed to work with a data array in the logic simulation algorithm to provide stimulus to the circuit and extract outputs from the circuit. Because the framework is designed to work with a logic simulator, internal nodes can be included in the outputs extracted.

Based on the selected test and the boundary scan description, a data array is generated in step 114. The data array, which may be a VERILOG™ compatible read only memory (ROM) structure, contains the input values to apply to the circuit and the expected output values that should correspondingly appear as a result of the applying the input values.

At step 116, the logic simulation algorithm is used to test the test architecture based on the test parameters and the circuit topology information. In the VERILOG™ platform, step 116 involves running a logic simulation using the VERILOG™ test parameters, or vectors, as stimulus for the VERILOG™ netlist. Using the stimulus framework and the data array, the input values are applied to the circuit in step 118 and the resulting output values are extracted in step 120. The extracted output values are then compared with the expected output values in step 122 to determine if the circuit is functioning correctly. In step 124, a report is generated that details positions in the data array where the output values do not match the expected output values.

Figure 2:
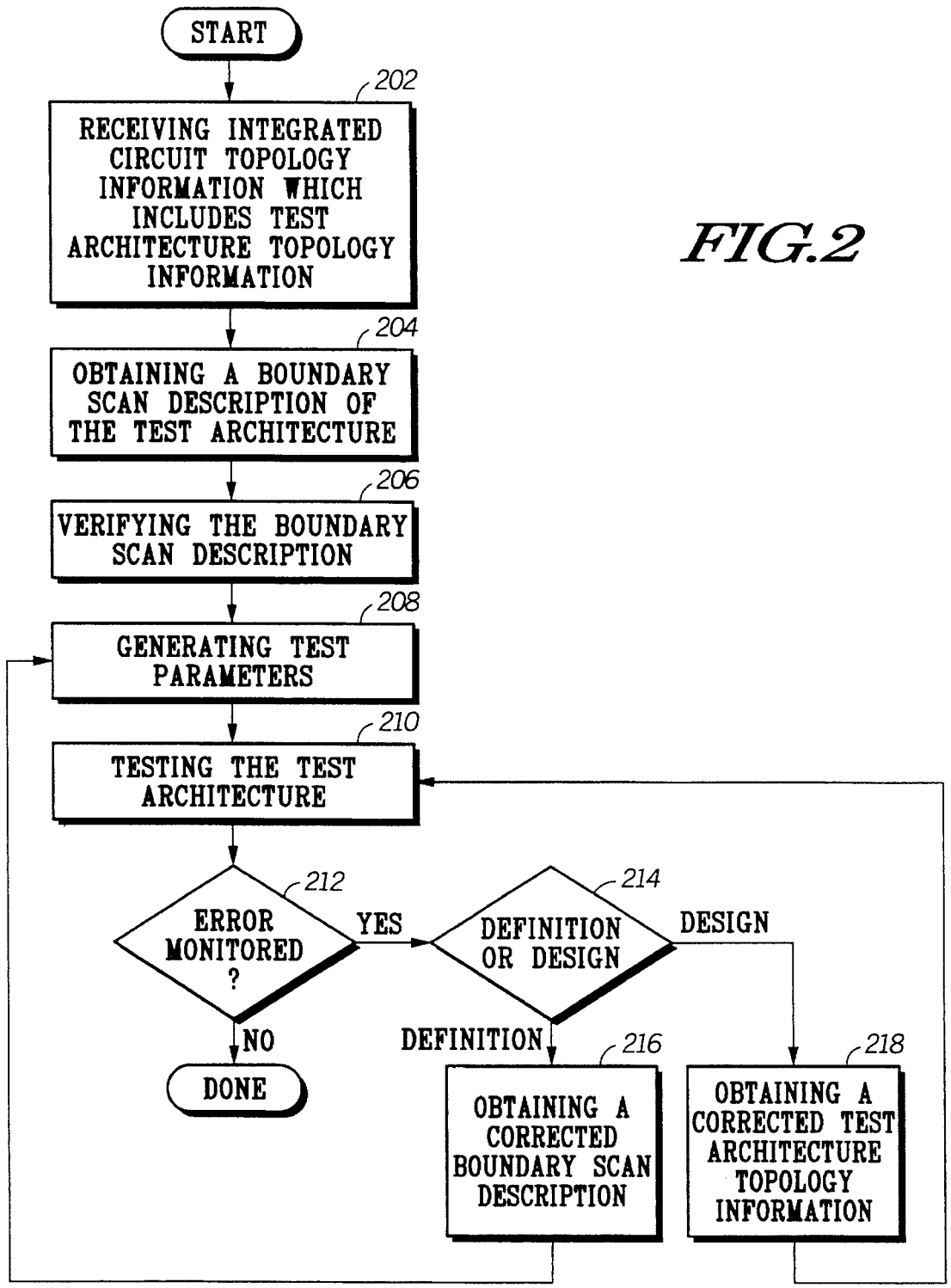
FIG. 2 illustrates, in a logic diagram, a method for testing an integrated circuit in accordance with the present invention.

FIG. 2 illustrates, in a logic diagram, a method for testing an IC, wherein the IC includes a test architecture. In step 202, IC topology information which includes test architecture topology information is received. This step corresponds to step 102 of FIG. 1, wherein the present circuit is an IC.

At step 204, a boundary scan description of the test architecture is obtained. The boundary scan description, such as a BSDL file, can either be obtained from an external source, such as a text editor, or obtained by using the BSDL interface described above in conjunction with the information supplied in the test architecture topology information. The boundary scan description is verified in step 206, which corresponds to step 106 of FIG. 1.

In step 208, test parameters for a logic simulation algorithm are generated based on the boundary scan description, wherein the logic simulation algorithm is used to test the IC. The test parameters generated are structured to thoroughly exercise the test architecture on the IC.

The IC is tested with the logic simulation algorithm in step 210 based on a least a portion of the test parameters. The testing is monitored in step 212 for an error, wherein the error can be a definition error in the boundary scan description or a design error in the test architecture topology information. Because a logic simulation algorithm is being used, an error can be detected at an internal node of the IC as well as at an external pin of the IC. Prior art techniques do not have the ability to specifically monitor these internal nodes. By examining the internal nodes, an error that originates at an internal node can be detected immediately and flagged, wherein a prior art technique would have to wait for the error to propagate to an external pin before it could be detected, at which point the user would have a difficult time determining the cause of the error.

If an error is monitored, an error correction is obtained. In step 214, it is determined whether the error is a definition error or a design error. If the error is a definition error, which would be an error in the boundary scan description, obtaining an error correction further comprises obtaining a corrected boundary scan description in step 216, wherein the corrected boundary scan description includes the error correction.

For example, if the boundary scan description contains an error where the ordering of two adjacent pins has been reversed, one being an input and one being an output, the error would not be detected until testing was performed. The boundary scan description is correct in all ways except that it doesn't match the test architecture that it is intended to describe. At this point, the user can go back to the BSDL interface, read in the boundary scan description with the error, and re-order the two pins using the interface to generate the corrected boundary scan description. Corrected test parameters are then generated based on the corrected boundary scan description, and the IC is re-tested with the logic simulation algorithm based on the corrected test parameters.

If a design error is monitored, obtaining an error correction further comprises obtaining corrected test architecture topology information which includes the error correction. For example, if a missing wire, or net, in the test architecture topology information is monitored during simulation, the user can edit the test architecture topology information to add the missing wire and produce corrected test architecture topology information. The IC is then re-tested using the corrected test architecture topology information.

Figure 3:
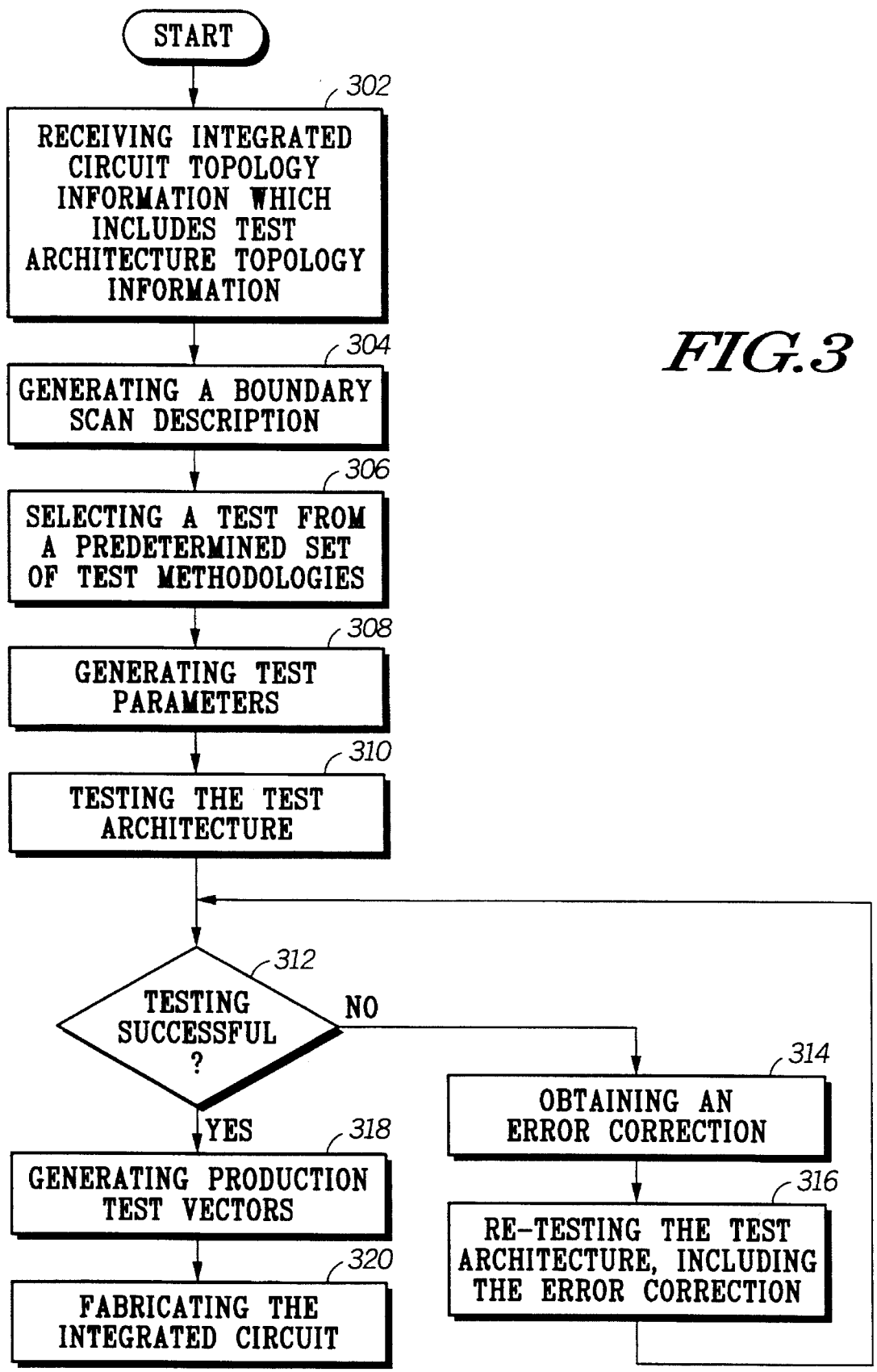
FIG. 3 illustrates, in a logic diagram, a method for producing an integrated circuit in accordance with the present invention.

FIG. 3 illustrates, in a logic diagram, a method for producing an integrated circuit. IC topology information is received in step 302, which corresponds to step 202 in FIG. 2. A boundary scan description is generated in step 304, which corresponds to step 104 of FIG. 1. A test is selected in step 306, test parameters are generated at step 308, and the test architecture is tested in step 310, wherein steps 306, 308, and 310 correspond to steps 108, 110, and 116 of FIG. 1 respectively.

In step 312, it is determined whether or not testing was successful, wherein a successful test identifies no design errors and no definition errors. If an error is detected, an error correction is obtained in step 314. The test architecture is then re-tested in step 316, wherein re-testing includes the error correction.

When testing is successful, production test vectors are generated in step 318 based on the boundary scan description. A tester will use the production test vectors to test the IC once it has been fabricated. The IC is fabricated in step 320 based on the IC topology information, which can include one or more error corrections.

Figure 4:
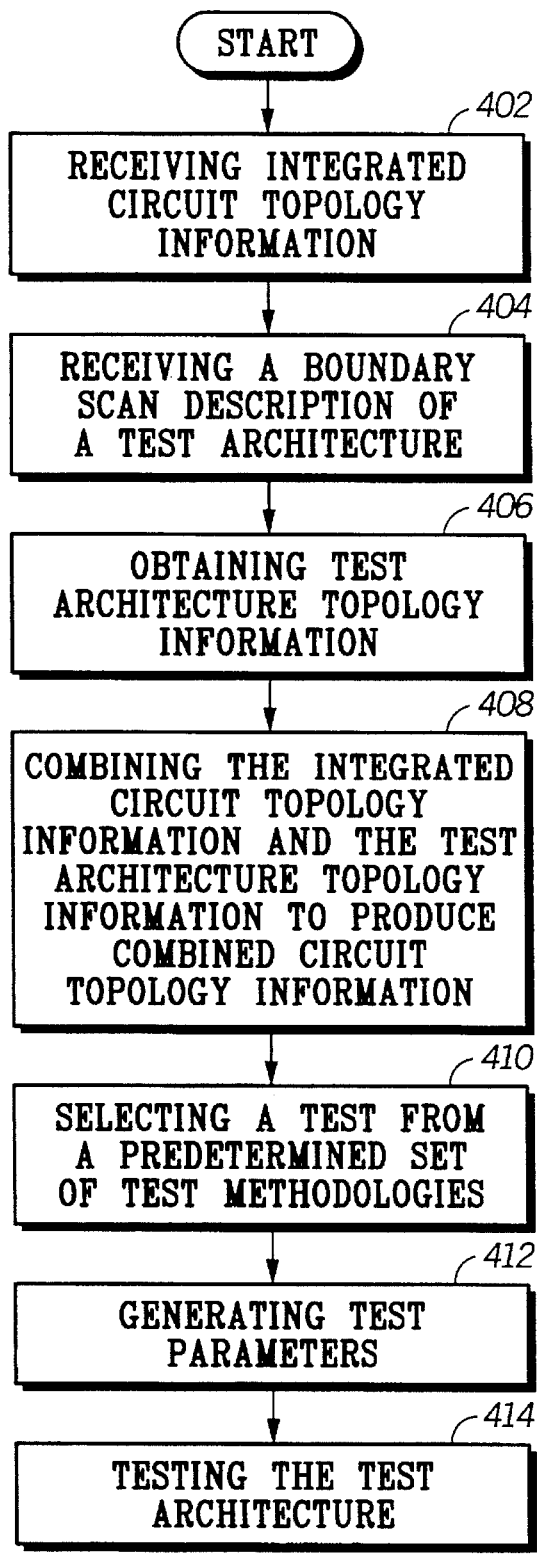
FIG. 4 illustrates, in a logic diagram, a method for testing a test architecture within an integrated circuit in accordance with the present invention.

FIG. 4 illustrates, in a logic diagram, method for testing a test architecture within an integrated circuit. In step 402, integrated circuit topology information is received, which corresponds to step 102 of FIG. 1, but in this instance, the IC topology information does not include test architecture topology information. A boundary scan description of a test architecture is received at step 404. The boundary scan description, or BSDL file, could be generated using the generation interface described, based upon the IC topology information.

In step 406, test architecture topology information is obtained based on the boundary scan description and IC topology information. The test architecture topology information can be synthesized based on the IC topology information and the boundary scan description. The cells in the test architecture topology information are normally of a standard architecture, which greatly simplifies the synthesis process. Standard cells can be developed for the different blocks in the test architecture, which are then automatically coupled together according to the requirements defined by the BSDL file and the IC topology information.

At step 408, the IC topology information and the test architecture topology information are combined to produce combined circuit topology information. Because the test architecture topology information is based on the IC topology information, the combination of the two is straightforward.

A test is selected from a set of predetermined test methodologies for testing the test architecture within the combined circuit topology information in step 410, which corresponds to step 108 of FIG. 1. In step 412, test parameters are generated for a logic simulation algorithm based on the test parameters and the combined circuit topology information, which corresponds to step 110 of FIG. 1. The test architecture is tested using the logic simulation in step 414 based on the combined circuit topology information, wherein the testing step corresponds to step 116 of FIG. 1.

The present invention provides a method for testing a test architecture within a circuit. With such a method, self-checking production and logic simulation test vectors are automatically generated, JTAG compliance is verified, BSDL descriptions for test architectures are generated and verified, and feedback is supplied to aid error correction in either the BSDL description or design of the test architecture.

We claim:

1. A method for testing a test architecture within a circuit, the method comprising the steps of:

receiving circuit netlist information for the circuit where the circuit netlist information is stored via a circuit netlist data file in computer memory, the circuit netlist information including test architecture topology information of the test architecture;

generating a boundary scan description of the test architecture based on the test architecture topology information wherein the boundary scan description describes various characteristics of the test architecture in a boundary scan description file stored in computer memory;

selecting a test from a predetermined set of test methodologies for testing the test architecture to result in a selected test;

generating test parameters for use with a logic simulation, the test parameters being based on both the boundary scan description and the selected test and being stored in the computer memory; and testing the test architecture with the logic simulation utilizing the test parameters and the test architecture topology information.

2. The method of claim 1 further comprises verifying the boundary scan description by verifying syntax, consistency, and standard compliance of the boundary scan description.

3. The method of claim 1, wherein the step of generating test parameters further comprises:

generating a stimulus framework for the logic simulation algorithm based on the boundary scan description; and generating a data array for the stimulus framework based on the selected test and the boundary scan description.

4. The method of claim 3, wherein the step of generating the data array further comprises generating input values and expected output values for the circuit.

5. The method of claim 4, wherein the step of testing the test architecture further comprises:

applying the input values to the circuit;

extracting output values from the circuit; and comparing the output values with the expected output values.

6. The method of claim 5 further comprises generating a report that details positions in the data array where the output values do not match the expected output values.

7. The method of claim 1, wherein the step of receiving circuit topology information further comprises receiving integrated circuit topology information as the circuit topology information.

8. A method for testing an integrated circuit, the method comprising the steps of:

a) receiving integrated circuit topology information of the integrated circuit, wherein the integrated circuit has a test architecture which allows the integrated circuit to participate in system-level testing operations, the integrated circuit topology information including test architecture topology information, the integrated circuit topology information being stored as a circuit netlist via computer-readable media;

b) obtaining a boundary scan description of the test architecture of the integrated circuit wherein the boundary scan description defines various physical features of the test architecture and is stored via computer readable media;

c) generating, based on the boundary scan description, test parameters for use by a logic simulation, wherein the logic simulation is used to test the integrated circuit;

d) exercising the integrated circuit via the logic simulation and the monitoring the excerising of the integrated circuit for any occurrence of an error the error being detected based on at least a portion of the test parameters; and e) obtaining an error correction for the error in response to the error being detected.

9. The method of claim 8, wherein the step of (d) comprises monitoring for a definition error in the boundary scan description.

10. The method of claim 9, wherein the step of obtaining the error correction further comprises obtaining a corrected boundary scan description, wherein the corrected boundary scan description includes the error correction.

11. The method of claim 10 further comprises:

generating, based on the corrected boundary scan description, correction test parameters for the logic simulation; and re-testing the integrated circuit based on the corrected test parameters.

12. The method of claim 8, wherein the step of monitoring for the error further comprises monitoring for a design error in the test architecture topology information.

13. The method of claim 12, wherein the step of obtaining the error correction further comprises obtaining corrected test architecture topology information, wherein the corrected test architecture topology information includes the error correction.

14. The method of claim 13 further comprises re-testing the integrated circuit using the corrected test architecture topology information.

15. The method of claim 8, wherein the step of exercising and monitoring for an error further comprises monitoring internal nodes and external pins of the integrated circuit for the error.

16. The method of claim 8, wherein the step of obtaining the boundary scan description further comprises obtaining the boundary scan description from an external source.

17. The method of claim 8, wherein the step of obtaining the boundary scan description further comprises generating the boundary scan description based on the test architecture topology information.

18. The method of claim 8 further comprises verifying the boundary scan description by verifying syntax, consistency, and standard compliance of the boundary scan description.

19. A method for producing an integrated circuit, the method comprising the steps of:

receiving integrated circuit topology information for the integrated circuit from an integrated circuit netlist stored in computer readable memory, wherein the integrated circuit has a boundary scan test architecture, and the integrated circuit topology information includes test architecture topology information;

generating a boundary scan description of the test architecture based on the test architecture topology information;

selecting a selected test from a predetermined set of test methodologies for testing the test architecture;

generating test parameters for a logic simulation based on the boundary scan description and the selected test;

testing the test architecture via simulation by utilizing a logic simulation which exercises the integrated circuit netlist based on the test parameters and the integrated circuit topology information; and fabricating the integrated circuit including the test architecture when the step of testing indicates that no errors occurred within the test architecture.

20. The method of claim 19 further comprises determining that no design errors in the integrated circuit topology information were identified during the testing, thereby indicating that the testing was successful.

21. The method of claim 19 further comprises determining that no definition errors in the boundary scan description were identified during the testing, thereby indicating that the testing was successful.

22. The method of claim 19, wherein the step of testing further comprises:

while testing the test architecture, detecting an error;

obtaining an error correction; and re-testing the test architecture, using the error correction.

23. The method of claim 22 further comprises determining that the re-testing was successful.

24. The method of claim 19 further comprises generating production test vectors based on the boundary scan description, wherein the production test vectors are used for testing the integrated circuit.

25. A method for testing a test architecture within an integrated circuit, the method comprising:

receiving integrated circuit topology information for an integrated circuit from computer memory;

receiving a boundary scan description of a test architecture, wherein the boundary scan description is based on the integrated circuit topology information from the computer memory;

obtaining test architecture topology information, wherein the test architecture topology information is based on the boundary scan description and the integrated circuit topology information;

combining the integrated circuit topology information and the test architecture topology information to produce combined circuit topology information;

selecting a test from a predetermined set of test methodologies for testing the test architecture within the combined circuit topology information;

generating test parameters for a logic simulation based on the boundary scan description and the selected test; and testing the test architecture with the logic simulation based on the test parameters and the combined circuit topology information.

26. The method of claim 25, wherein the step of obtaining test architecture topology information further comprises synthesizing the test architecture topology information based on the integrated circuit topology information and the boundary scan description.

27. A method for testing JTAG circuitry within an integrated circuit, the method comprising the steps of:

providing the JTAG circuitry in a circuit netlist data file;

reading the circuit netlist data file obtain JTAG topology information relating to the JTAG circuitry;

generating a boundary scan description of the JTAG circuitry based upon the JTAG topology information;

selecting a selected JTAG circuitry test from a plurality of potential JTAG circuitry tests displayed via a graphical user interface on a computer screen;

generating test vectors for use by a simulation tool wherein the test vectors are based upon the selected JTAG circuitry test and the boundary scan description; and testing the JTAG test architecture using the test vectors to ensure that the JTAG circuitry is compliant with JTAG standards.

28. A tester for testing a test circuit portion of an integrated circuit wherein the integrated circuit and test circuit portion are represented in a netlist data file, the tester comprising:

means for receiving the netlist data file and extracting test circuit topology information from the netlist data file;

means for generating a boundary scan description of the test circuit portion based upon the test circuit topology information;

means for selecting a selected test from a plurality of predetermined tests wherein the tests are used by a simulation program which exercises the netlist data file to determine correct operation of the test circuit portion;

means for generating test parameters for use by the simulation program to determine correct operation of the test circuit portion, the test parameters being based upon the boundary scan description and the selected test; and means for testing the test circuit portion with the simulation program by using the test parameters and the netlist data file.

29. A tester, stored on computer readable storage, for testing a test circuit portion of an integrated circuit wherein the integrated circuit and test circuit portion are represented in a netlist data file, the computer readable storage comprising:

a plurality of computer instructions for receiving the netlist data file and extracting test circuit topology information from the netlist data file;

a plurality of computer instructions for generating a boundary scan description of the test circuit portion based upon the test circuit topology information;

a plurality of computer instructions for selecting a selected test from a plurality of predetermined tests wherein the tests are used by a simulation program which exercises the netlist data file to determine correct operation of the test circuit portion;

a plurality of computer instructions for generating test parameters for use by the simulation program to determine correct operation of the test circuit portion, the test parameters being based upon the boundary scan description and the selected test; and a plurality of computer instructions for testing the test circuit portion with the simulation program by using the test parameters and the netlist data file.

* * * * *

UNITED STATES PATENT AND TRADEMARK OFFICE
CERTIFICATE OF CORRECTION

PATENT NO. : 5,517,637
DATED : May 14, 1996
INVENTOR(S) : William C. Bruce, Jr.; Joseph E. Drufke, Jr.; Chema O. Eluwa; and John M. Hudson It is certified that error appears in the above-indentified patent and that said Letters Patent is hereby corrected as shown below:

Column 8, line 2, after "and", delete "the".

Signed and Sealed this

Fourth Day of November, 1997

Attest:

BRUCE LEHMAN

Attesting Officer

Commissioner of Patents and Trademarks